(12) United States Patent
Song et al.

(10) Patent No.: US 7,244,923 B2
(45) Date of Patent: Jul. 17, 2007

(54) SURFACE EMITTING LASER DEVICE INCLUDING OPTICAL SENSOR AND OPTICAL WAVEGUIDE DEVICE EMPLOYING THE SAME

(75) Inventors: Hyun Woo Song, Daejeon (KR); Jong Hee Kim, Daejeon (KR); Yong Sung Eom, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 11/232,661

(22) Filed: Sep. 21, 2005

(65) Prior Publication Data

US 2006/0124829 A1 Jun. 15, 2006

(30) Foreign Application Priority Data

Dec. 10, 2004 (KR) .................. 10-2004-0104332
May 19, 2005 (KR) .................. 10-2005-0041909

(51) Int. Cl.
*H01L 31/00* (2006.01)
(52) U.S. Cl. .............................. 250/214.1; 372/29.02; 372/75; 257/79
(58) Field of Classification Search ............. 250/214.1, 250/205; 372/29.01–29.03, 43–50, 75; 385/31, 39; 257/13, 79
See application file for complete search history.

(56) References Cited

U.S. PATENT DOCUMENTS

| | | | |
|---|---|---|---|
| 5,266,794 A | 11/1993 | Olbright et al. | |
| 5,574,738 A | 11/1996 | Morgan | |
| 5,648,979 A | 7/1997 | Mun et al. | |
| 5,742,630 A | 4/1998 | Jiang et al. | |
| 5,757,836 A | 5/1998 | Jiang et al. | |
| 5,974,071 A | 10/1999 | Jiang et al. | |
| 5,978,401 A | 11/1999 | Morgan | |

(Continued)

FOREIGN PATENT DOCUMENTS

EP 0753912 A1 1/1997

(Continued)

OTHER PUBLICATIONS

"Oxide-apertured photodetector integrated on VCSEL", L.Y. Han, et al., Cleo 1999, Tuesday Afternoon, 1 page, May 23-28, 1999.

(Continued)

*Primary Examiner*—George Epps
*Assistant Examiner*—Patrick J. Lee
(74) *Attorney, Agent, or Firm*—Blakely Sokoloff Taylor & Zafman

(57) ABSTRACT

Provided are a surface emitting laser device having an optical sensor, and an optical waveguide device employing the same. The surface emitting laser device having an optical sensor includes a surface emitting laser formed on a substrate and generating a laser beam to output it to outside, and an optical sensor formed adjacent to the surface emitting laser on the substrate and receiving external light. In the surface emitting laser device having the optical sensor, and the optical waveguide device employing the same, the surface emitting laser and the optical sensor are simultaneously integrated, however, the performance of the surface emitting laser is unaffected by the optical sensor and the optical sensor operates separately, exhibits high performance, and can respond within a wide wavelength band.

10 Claims, 7 Drawing Sheets

U.S. PATENT DOCUMENTS

| | | |
|---|---|---|
| 6,001,664 A | 12/1999 | Swirhun et al. |
| 6,023,485 A | 2/2000 | Claisse et al. |
| 6,389,050 B2 | 5/2002 | Stronczer |
| 6,392,256 B1 | 5/2002 | Scott et al. |
| 6,470,116 B2 | 10/2002 | Kim et al. |
| 6,470,118 B1 | 10/2002 | Uno |
| 6,526,078 B2 * | 2/2003 | Lee .................. 372/31 |
| 6,526,080 B1 | 2/2003 | Shin |
| 7,012,274 B2 * | 3/2006 | Taylor ................ 257/12 |
| 7,053,415 B2 * | 5/2006 | Swirhun et al. ........ 257/82 |
| 2003/0185266 A1 | 10/2003 | Henrichs |

FOREIGN PATENT DOCUMENTS

| | | |
|---|---|---|
| EP | 0 753 912 | 9/1998 |
| KR | 1997-0054979 | 7/1997 |
| KR | 1998-030012 | 7/1998 |

OTHER PUBLICATIONS

"Optimization of VCSEL with an Integrated REsonant Photodetector", S. Lim, et al., 1998 IEEE, Semiconductor Laser Conference 1998, Oct. 4-8, 1998, pp. 101-102.

"Inverting and Latching Optical Logic Gates Based on the Integration of Vertical-Cavity Surface-Emitting Lasers and Photothyristors" by Ping Zhou, et al.; IEEE Photonics Technology Letters, No. 2; Feb. 1992; New York, US.

* cited by examiner

SURFACE EMITTING LASER DEVICE INCLUDING OPTICAL SENSOR AND OPTICAL WAVEGUIDE DEVICE EMPLOYING THE SAME

CROSS-REFERENCE TO RELATED APPLICATION

This application claims the priority of Korean Patent Application No. 2004-104332, filed Dec. 10, 2004 and Korean Patent Application No. 2005-41909, filed May 19, 2005, the disclosure of which is incorporated herein in its entirety by reference.

BACKGROUND

1. Field of the Invention

The present invention relates to a surface emitting laser device including an optical sensor and optical waveguide device employing the same, and more specifically, to a surface emitting laser device in which a surface emitting laser and an optical sensor are simultaneously integrated and the optical sensor is capable of responding within a wide wavelength band without affecting the optical output performance of the surface emitting laser, and optical waveguide device employing the same.

2. Discussion of Related Art

Recently, a surface emitting laser applicable in the field of optical communications has been the focus of considerable attention due to its ease of high-density integration, low power consumption, and low cost. In addition, since there is often need to transmit a signal from one point to another point at a remote site, and also receive back a signal from the point at the remote site through the same line, there is increasing need for a module having a light source and an optical sensor integrated therein.

In particular, there have been various suggestions for integrating a surface emitting laser with an optical sensor using structural characteristics of the surface emitting laser.

Generally, forms in which a surface emitting laser is integrated with an optical sensor include an integrated structure having a PIN photodetector disposed above a surface emitting laser along an optical output path thereof, an integrated structure having an absorbent layer disposed inside a resonator of a surface emitting laser, a structure having an absorbent layer disposed on a surface emitting laser and an optical sensor disposed adjacent thereto, a structure having a metal-semiconductor-metal (MSM) photodetector disposed on a surface emitting laser and at a location adjacent thereto, a structure having a surface emitting laser and an optical sensor disposed adjacent to each other, and so on. Such integrated structures have applications in optical coupling and two-way communication of surface emitting lasers and for monitoring and controlling optical output power of a surface emitting laser.

These methods for integrating a surface emitting laser with an optical sensor have the characteristics as described below.

First, the integrated structure having a PIN photodetector disposed above the surface emitting laser along the optical output path has the benefit of directly sensing output light by absorbing a part of the output light.

However, this structure has the drawback of a loss in output light and affects on the operation of the laser caused by the reflectance change of output light.

The integrated structure having an absorbent layer disposed inside a resonator of a surface emitting laser shows very good characteristics. However, its characteristics are sensitive to an absorption band of the absorbent layer and change in the location of the absorbent layer within the resonator. And in particular, it has a weakness with regard to environmental changes such as a temperature change.

The structure having absorbent layers disposed on a surface emitting laser and an optical sensor disposed adjacent thereto, and the structure having a metal-semiconductor-metal (MSM) photodetector disposed on a surface emitting laser and at a location adjacent thereto have a disadvantage in that an optical sensor or MSM photodetector grown on a thickly grown structure is hardly suitable for high-speed and high-sensitivity operation.

The structure having a surface emitting laser and an optical sensor disposed adjacent to each other has the advantage of a large optical sensor response. However, due to a narrow response bandwidth, it cannot be used for applications like two-way communication using considerably different wavelength bands for transmitting signals in either direction.

Accordingly, there is need for an integrated surface emitting laser and optical sensor, and method for their integration, that overcome the drawbacks of the conventional technology so that the performance of the surface emitting laser is unaffected by the optical sensor and the optical sensor independently exhibits high performance and can respond within a wide wavelength band.

SUMMARY OF THE INVENTION

It is an object of the present invention to provide a surface emitting laser device including an optical sensor and optical waveguide device employing the same, in which a surface emitting laser for optical communication and an optical sensor are simultaneously integrated, optical output performance of the surface emitting laser is not affected by the optical sensor, which operates independently, exhibits high performance, and can respond within a wide wavelength band.

One aspect of the present invention provides a surface emitting laser device comprising a surface emitting laser formed on a substrate and generating a laser beam to output it to outside, and an optical sensor formed adjacent to the surface emitting laser on the substrate and receiving external light.

The surface emitting laser may be formed to have a predetermined structure in which a semiconductor layer, a first reflector, a first cladding layer, an active layer, a second cladding layer, and a second reflector are stacked in sequence on a substrate. And, the optical sensor may be formed adjacent to the surface emitting laser on the substrate to have a predetermined structure in which a part of the semiconductor layer and the first reflector are exposed.

The surface emitting laser may further include a lower electrode formed on an exposed part of the first cladding layer, a upper electrode formed on an exposed part of the second cladding layer, and an absorbent layer formed on a side surface adjacent to the optical sensor.

The optical sensor may further include a lower electrode formed on an exposed area of the substrate, and a upper electrode formed on an exposed part of the semiconductor layer.

Another aspect of the present invention provides an optical waveguide device comprising a surface emitting laser formed on a substrate and generating a laser beam to output it to outside, an optical sensor formed adjacent to the surface emitting laser on the substrate and receiving external light, and an optical waveguide guiding light emitted by the surface emitting laser and to be received by the optical sensor.

According to the present invention, the surface emitting laser and the optical sensor are simultaneously integrated, the performance of the surface emitting laser is unaffected by the optical sensor which operates separately, exhibits high performance, and can respond within a wide wavelength band.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF PREFERRED EMBODIMENTS

Hereinafter, a surface emitting laser device including an optical sensor and a method for fabricating the same according to the present invention will be described more fully with reference to the accompanying drawings.

Figure 1:
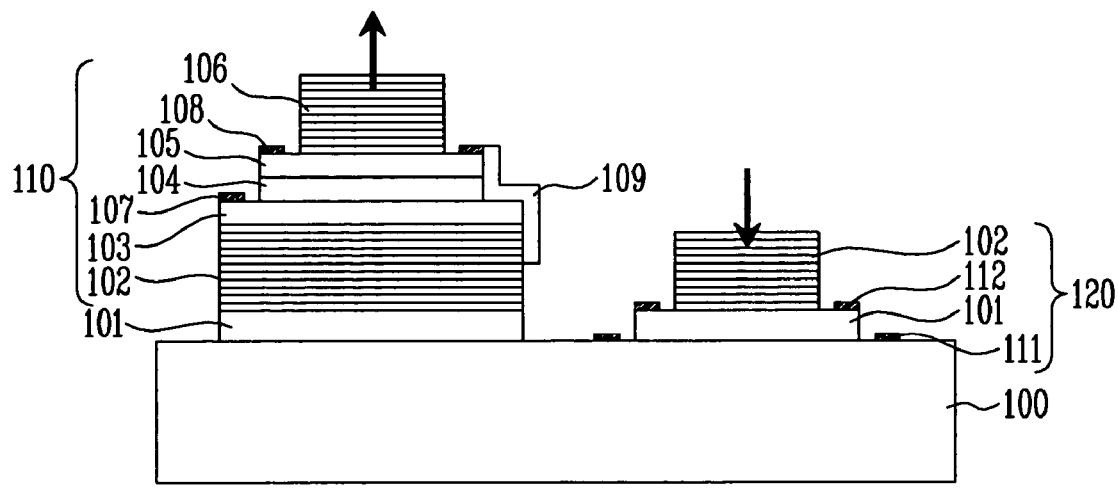
FIG. 1 is a cross-sectional view illustrating a structure of a surface emitting laser device including an optical sensor according to a first embodiment of the present invention.

FIG. 1 is a cross-sectional view illustrating a structure of a surface emitting laser device including an optical sensor according to a first embodiment of the present invention. As shown in FIG. 1, the surface emitting laser device includes a surface emitting laser 110 and an optical sensor 120. The surface emitting laser 110 is formed to have a predetermined structure in which a first reflector 102, a first cladding layer 103, an active layer 104, a second cladding layer 105, and a second reflector 106 are stacked in sequence on a semiconductor layer 101. The optical sensor 120 is formed adjacent to the surface emitting laser 110 on the substrate 100 to have a structure in which a part of the semiconductor layer 101 and the first reflector 102 are exposed.

The surface emitting laser 110 further includes a first lower electrode 107 formed on an exposed part of the first cladding layer 103, a first upper electrode 108 formed on an exposed part of the second cladding layer 105, and an absorbent layer 109 formed on a side surface adjacent to the optical sensor 120.

The optical sensor 120 further includes a second lower electrode 111 formed on an exposed area of the substrate 100, and a second upper electrode 112 formed on an exposed part of the semiconductor layer 101.

The first reflector 102 of the optical sensor 120 reflects light output from the surface emitting laser 110.

Figure 2:
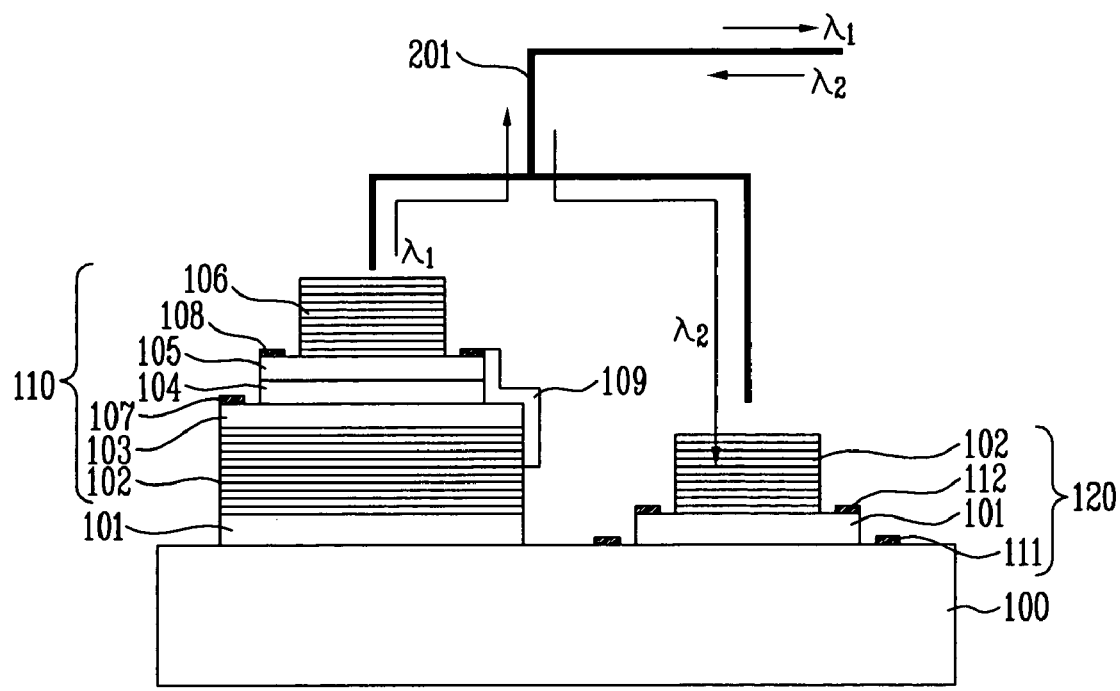
FIG. 2 is a cross-sectional view illustrating optical transmission and reception of the surface emitting laser device of FIG. 1 including an optical sensor and connected to an optical waveguide.
Figure 3:
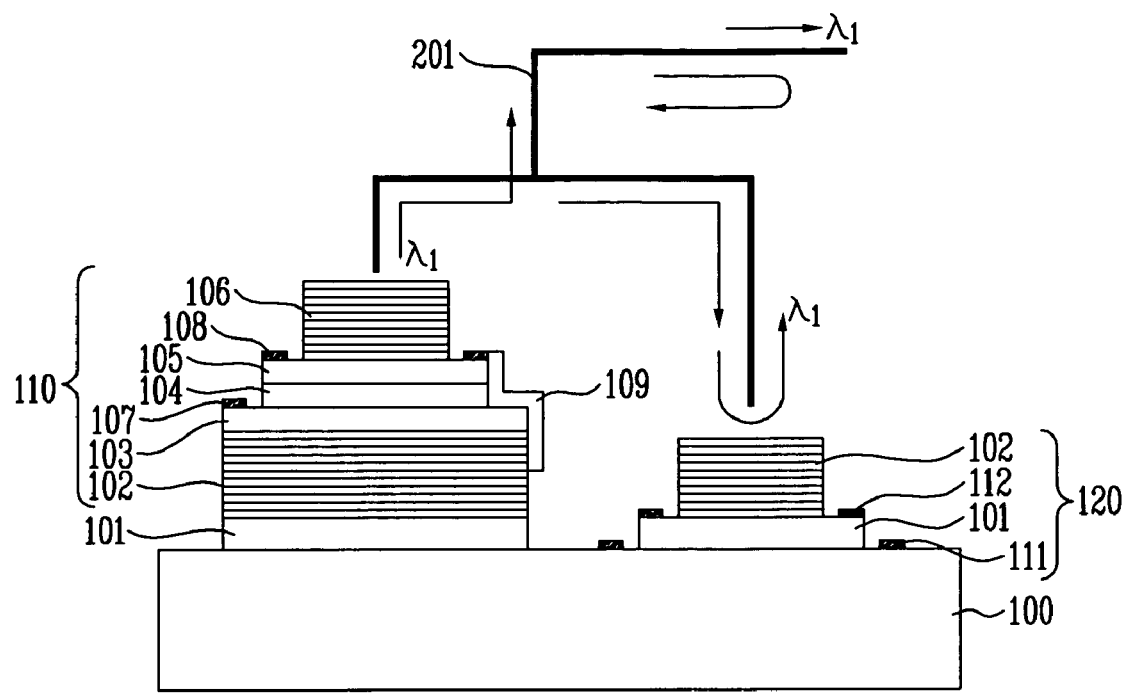
FIG. 3 is a cross-sectional view illustrating optical transmission and interception of the surface emitting laser device of FIG. 1 including an optical sensor and connected to an optical waveguide.

FIG. 2 is a cross-sectional view illustrating optical transmission and reception of the surface emitting laser device of FIG. 1 including an optical sensor and connected to an optical waveguide, and FIG. 3 is a cross-sectional view illustrating optical transmission and interception of the surface emitting laser device of FIG. 1 including an optical sensor and connected to an optical waveguide. As shown in FIGS. 2 and 3, an optical waveguide 201 is connected to the surface emitting laser device so that the surface emitting laser 110 transmits an optical signal with a wavelength $\lambda 1$ through the optical waveguide 201, and an input signal with a wavelength $\lambda 2$ is received by the optical sensor 120. Thereby, the surface emitting laser device functions as a bidirectional module.

Here, a filter transmits the signal of wavelength $\lambda 2$, which includes a signal to be received, and reflects the signal of wavelength $\lambda 1$ output from the surface emitting laser 110, thus intercepting feedback of a transmission signal and optical signal noise in the optical waveguide 201. In other words, the first reflector 102 of the optical sensor 120 functions as the filter.

Figure 4A:
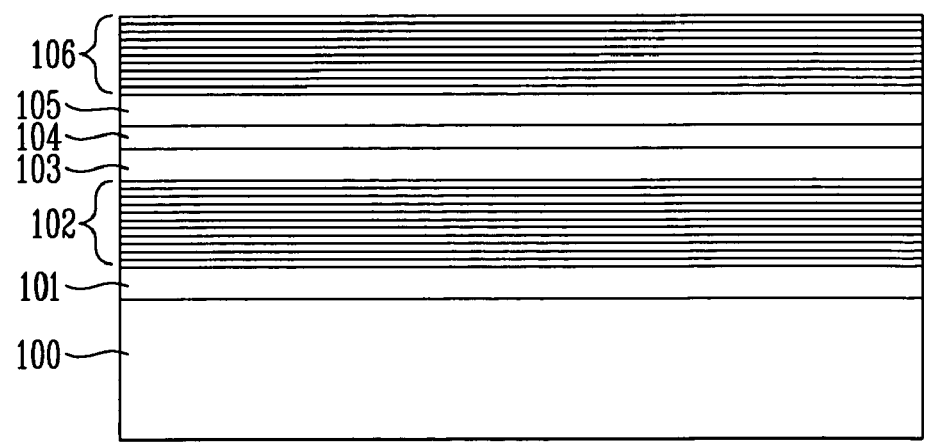
FIGS. 4A, 4B, and 4C are cross-sectional views illustrating a method of fabricating the surface emitting laser device including an optical sensor according to the first embodiment of the present invention.
Figure 4B:
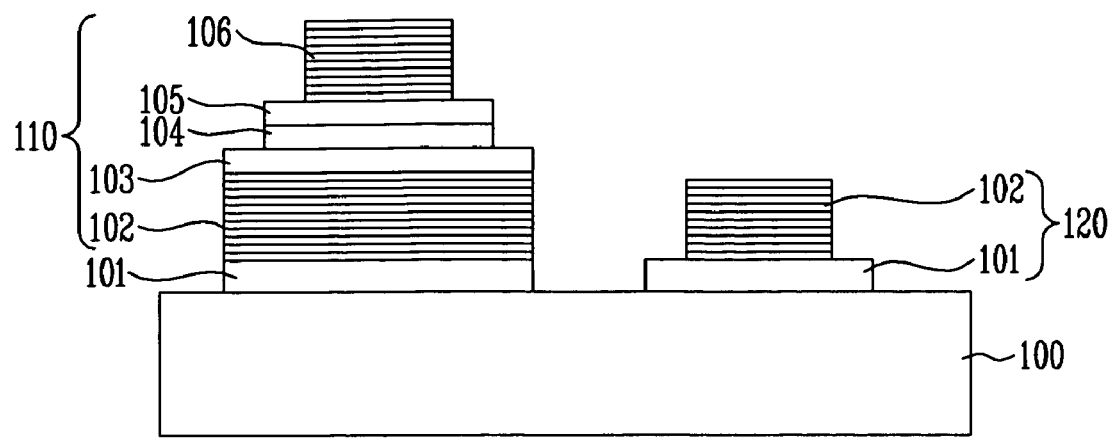
Figure 4C:
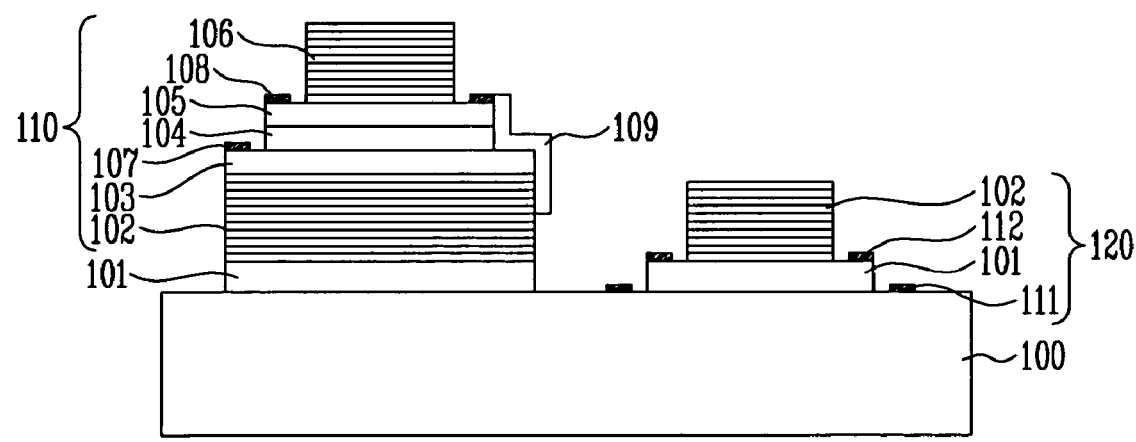

FIGS. 4A, 4B, and 4C are cross-sectional views illustrating a method of fabricating the surface emitting laser device including an optical sensor according to the first embodiment of the present invention.

First, as shown in FIG. 4A, a semiconductor layer 101, a first reflector 102, a first cladding layer 103, a active layer 104, a second cladding layer 105, and a second reflector 106 are grown and stacked in sequence on a substrate 100.

The semiconductor layer 101 is formed of InGaAsP, InGaAs, InGaAlAs, InP, etc., the first reflector 102 is formed of an undoped semiconductor or a dielectric distributed bragg reflector (DBR), the first cladding layer 103 is formed of InP/InGaAlAs or GaAs/Al(Ga)As, the active layer 104 is formed of InAlGaAs, In(Al)GaAs, or InAlAs, the second cladding layer 105 is formed of InP/InGaAlAs or GaAs/Al(Ga)As, the second reflector 106 is formed of an undoped semiconductor or a dielectric DBR, and the substrate 100 is formed of an InP or GaAs compound.

The first and second reflectors 102 and 106 may be formed by a process of semiconductor crystal growth, dielectric deposition, or a combination of the two. In the case of a process including dielectric deposition, the process may be performed after forming an electrode or etching a semiconductor.

Here, the semiconductor layer 101 formed on the substrate 100 is for forming the optical sensor 120. The optical sensor 120 having high sensitivity can be formed by growing the semiconductor layer 101 first on the substrate 100.

Subsequently, as shown in FIG. 4B, the layers stacked on the substrate 100 are selectively etched. Thereby, a first area and a second area are formed adjacent to each other, a part of the first cladding layer 103 and a part of the second cladding layer 105 in the first area are exposed, and a part of the semiconductor layer 101 and the first reflector 102 in the second area are exposed.

More specifically, first, the layers stacked on the substrate 100 are etched to be formed into the separate first and second areas. Here, the surface emitting laser 110 is formed in the first area, and the optical sensor 120 is formed in the second area. Although the surface emitting laser 110 and the optical sensor 120 operate separately, they are formed simultaneously.

Subsequently, photoresist is applied on the second reflector 106 in the first and second areas, and then an etch mask is formed by exposing and developing the photoresist. The second reflector 106 in the first area is patterned using the etch mask so that a part of the second cladding layer 105 is exposed, and the second reflector 106 in the second area is removed.

Next, the active layer 104 and the second cladding layer 105 formed on the first cladding layer 103 in the first area are etched so that a part of the first cladding layer 103 is exposed. Here, the second cladding layer 105, the active layer 104, and the first cladding layer 103 formed in the second area are removed, and a part of the second reflector 102 is etched such that a part of the semiconductor layer 101 is exposed.

Subsequently, as shown in FIG. 4C, in the first area, the first lower electrode 107 is formed on the first cladding layer 103 and the first upper electrode 108 is formed on the second cladding layer 105. In the second area, the second lower electrode 111 is formed on the substrate 100 and the second upper electrode 112 is formed on the semiconductor layer 101.

In other words, the electrodes are formed in the first and second areas etched in a predetermined shape. Specifically, in the first area, metal is deposited on the exposed part of the second cladding layer 105 to form the first upper electrode 108, and on the exposed part of the first cladding layer 103 to form the first lower electrode 107.

In the second area, metal is deposited on the exposed part of the semiconductor layer 101 to form the second upper electrode 112, and on a part of the substrate 100 from which the semiconductor layer 101 is removed to form the second lower electrode 111.

After each of the electrodes is formed, the absorbent layer 109 is formed on a side surface of the first area adjacent to the second area, thereby preventing light radiated from the first area from affecting the second area. Here, the absorbent layer 109 may be formed on a side surface of the second area adjacent to the first area.

Figure 5:
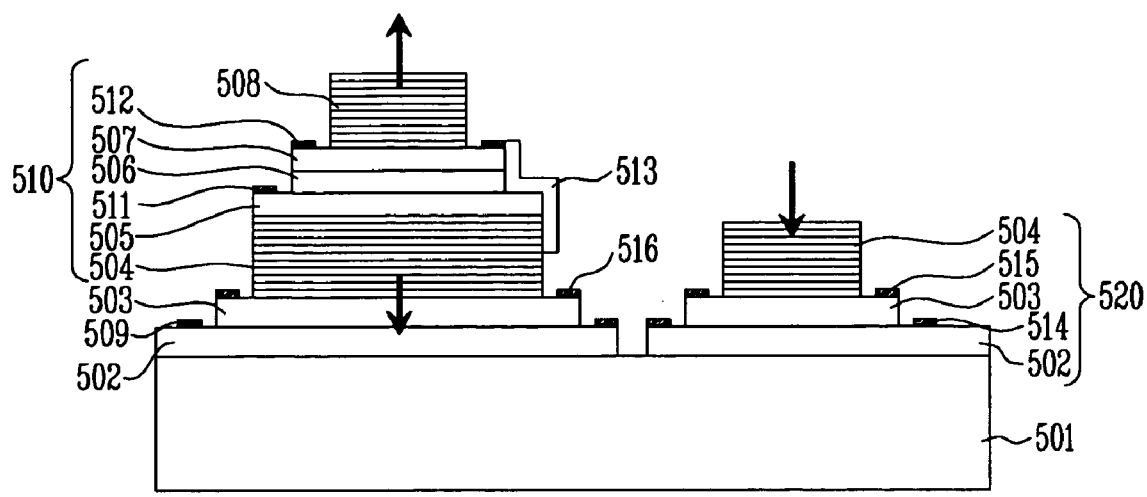
FIG. 5 is a cross-sectional view illustrating a structure of a surface emitting laser device including an optical sensor according to a second embodiment of the present invention.

FIG. 5 is a cross-sectional view illustrating a structure of a surface emitting laser device including an optical sensor according to a second embodiment of the present invention. Parts of the second embodiment that are not described in detail below are the same as in the first embodiment.

As shown in FIG. 5, the surface emitting laser device including an optical sensor according to the present invention comprises a surface emitting laser 510 and an optical sensor 520. The surface emitting laser 510 is formed to have a predetermined structure in which a first reflector 504, a first cladding layer 505, an active layer 506, a second cladding layer 507, and a second reflector 508 are stacked in sequence on a second semiconductor layer 503. The optical sensor 520 is formed adjacent to the surface emitting laser 510 on the substrate 501 to have a predetermined structure in which parts of the first and second semiconductor layers 502 and 503 and the first reflector 504 are exposed.

The surface emitting laser 510 further includes a first lower electrode 511 formed on an exposed part of the first cladding layer 505, a first upper electrode 512 formed on an exposed part of the second cladding layer 507, and an absorbent layer 513 formed on a side surface adjacent to the optical sensor 520.

The first semiconductor layer 502 and the second semiconductor layer 503 with sensing electrodes 509 and 516 formed on the exposed part of each semiconductor layer, respectively, function as an optical sensor monitoring and controlling light output from the surface emitting laser 510.

The optical sensor 520 further includes a second lower electrode 514 formed on an exposed part of the first semiconductor layer 502, and a second upper layer 515 formed on an exposed part of the second semiconductor layer 503.

The first reflector 504 of the optical sensor 520 functions as a filter reflecting light radiated from the surface emitting laser 510 and transmitting light input from outside.

Figure 6:
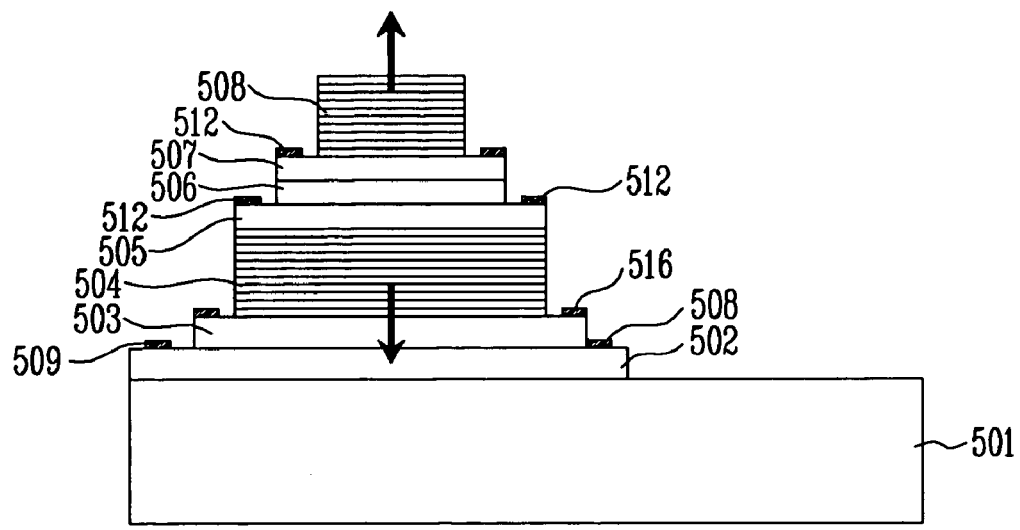
FIG. 6 is a cross-sectional view illustrating optical sensing of the surface emitting laser of FIG. 5.

FIG. 6 is a diagram illustrating optical sensing of the surface emitting laser of FIG. 5. As shown in FIG. 6, the first and second semiconductor layers 502 and 503 and the sensing electrodes 509 and 516 formed at a lower end of the surface emitting laser 510 function as an optical sensor monitoring and controlling light output from the surface emitting laser 510. Here, since the monitoring of light is performed using an extremely small amount of downward optical output power, a reflectance of the first reflector 504 is relatively high. Therefore, the performance and resonance condition of the surface emitting laser 510 are not affected and no optical output power is lost either.

In other words, it is possible to regulate the amount of light radiated from the surface emitting laser 510 by monitoring the sensed light.

Figure 7A:
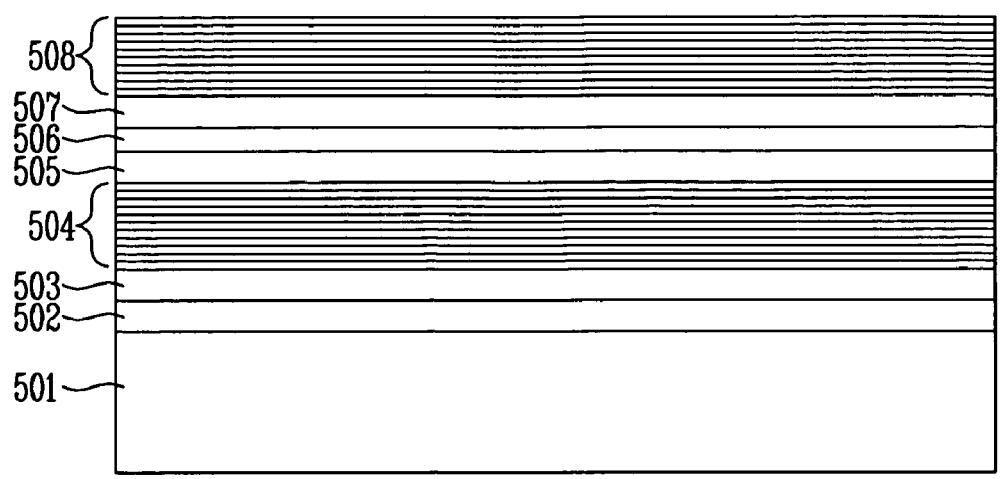
FIGS. 7A, 7B and 7C are cross-sectional views illustrating a method for fabricating the surface emitting laser device including an optical sensor according to the second embodiment of the present invention.
Figure 7B:
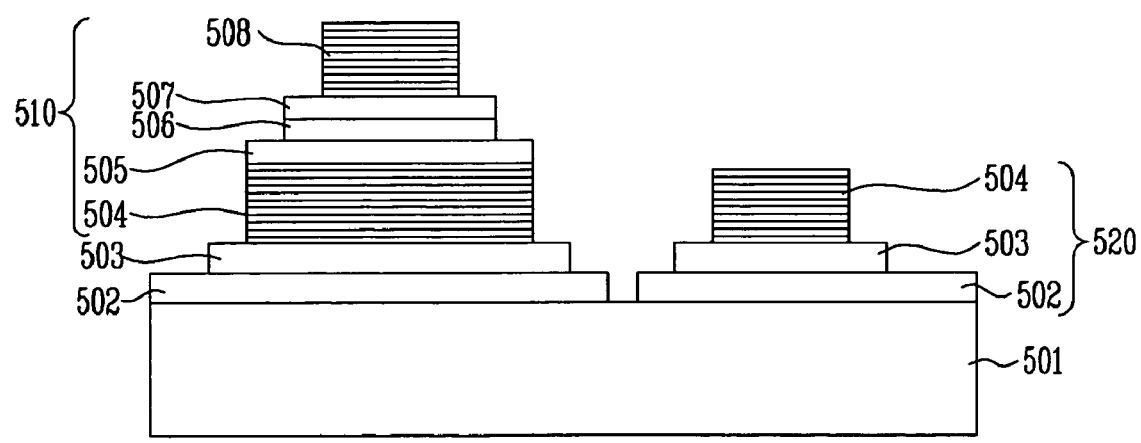
Figure 7C:
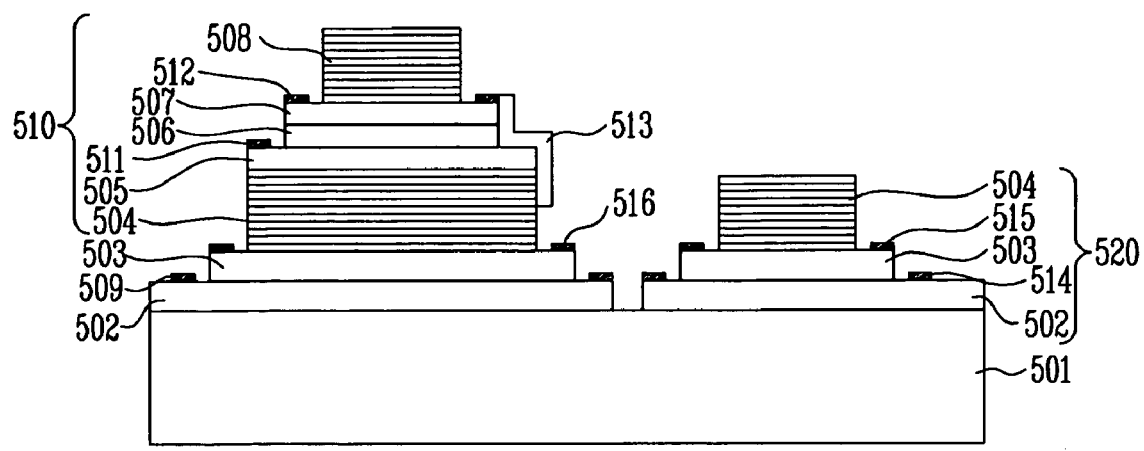

FIGS. 7A, 7B and 7C are cross-sectional views illustrating a method of fabricating the surface emitting laser device including an optical sensor according to the second embodiment of the present invention. Details not described below are the same as in the first embodiment described with reference to FIGS. 4A to 4C.

As shown in FIG. 7A, a first semiconductor layer 502, a second semiconductor layer 503, a first reflector 504, a first cladding layer 505, an active layer 506, a second cladding layer 507, and a second reflector 508 are grown and stacked in sequence on a substrate 501.

The first and second semiconductor layers 502 and 503 are formed of InGaAsP, InGaAs, InGaAlAs, InP, (Al)GaAs etc., the first reflector 504 is formed of an undoped semiconductor or a dielectric DBR, the first cladding layer 505 is formed of InP/InGaAlAs or GaAs/Al(Ga)As, the active layer 506 is formed of InAlGaAs, In(Al)GaAs, or InAlAs, the second cladding layer 507 is formed of InP/InGaAlAs or GaAs/Al(Ga)As, the second reflector 508 is formed of an undoped semiconductor or a dielectric DBR, and the substrate 501 is formed of an InP or GaAs compound.

The first and second reflectors 504 and 508 may be formed by a process of semiconductor crystal growth, dielectric deposition, or a combination of the two. In the case of a process including dielectric deposition, the process may be performed after forming an electrode or etching a semiconductor.

Here, the first semiconductor layer 502 formed on the substrate 501 is for optical sensing of the surface emitting laser 510 in a first area, and the second semiconductor layer 503 is for forming the optical sensor 520. The optical sensor 520 having high sensitivity can be formed by growing the first and second semiconductor layers 502 and 503 first on the substrate 501.

Subsequently, as shown in FIG. 7B, the layers stacked on the substrate 501 are selectively etched. Thereby, the first area and a second area are formed adjacent to each other, parts of the first semiconductor layer 502, the first cladding layer 505, and the second cladding layer 507 in the first area are exposed, and parts of the first and second semiconductor layers 502 and 503 and the first reflector 504 in the second area are exposed.

Next, as shown in FIG. 7C, in the first area, a sensing electrode 509 is formed on an exposed part of the first semiconductor layer 502, a sensing electrode 516 on the second semiconductor layer 503, a first lower electrode 511 on the first cladding layer 505, and a first upper electrode 512 on the second cladding layer 507. In the second area, a second lower electrode 514 is formed on the first semiconductor layer 502 and a second upper electrode 515 on the second semiconductor layer 503.

After each of the electrodes is formed, an absorbent layer 513 is formed on a side surface of the first area adjacent to the second area, thereby preventing light radiated from the first area from affecting the second area. Here, the absorbent layer 513 may be formed on a side surface of the second area adjacent to the first area.

Figure 8:
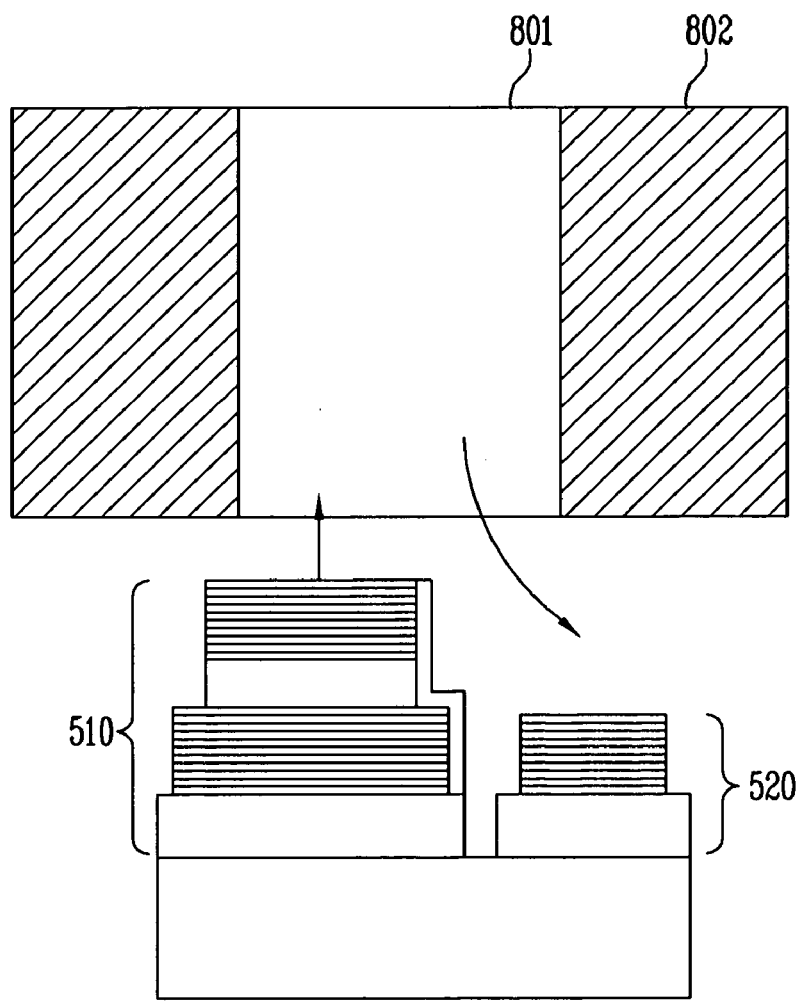
FIG. 8 is a cross-sectional view illustrating optical transmission and reception of a surface emitting laser device employing a multimode optical waveguide according to an embodiment of the present invention.

FIG. 8 is a diagram illustrating optical transmission and reception of a surface emitting laser device employing a multimode optical waveguide according to an embodiment of the present invention. As shown in FIG. 8, multimode optical fibers 801 and 802 may connect the surface emitting laser 510 with the optical sensor 520 integrated adjacent to the surface emitting laser 510. In other words, there is no need for separating optical transmission and reception waveguides.

Figure 9:
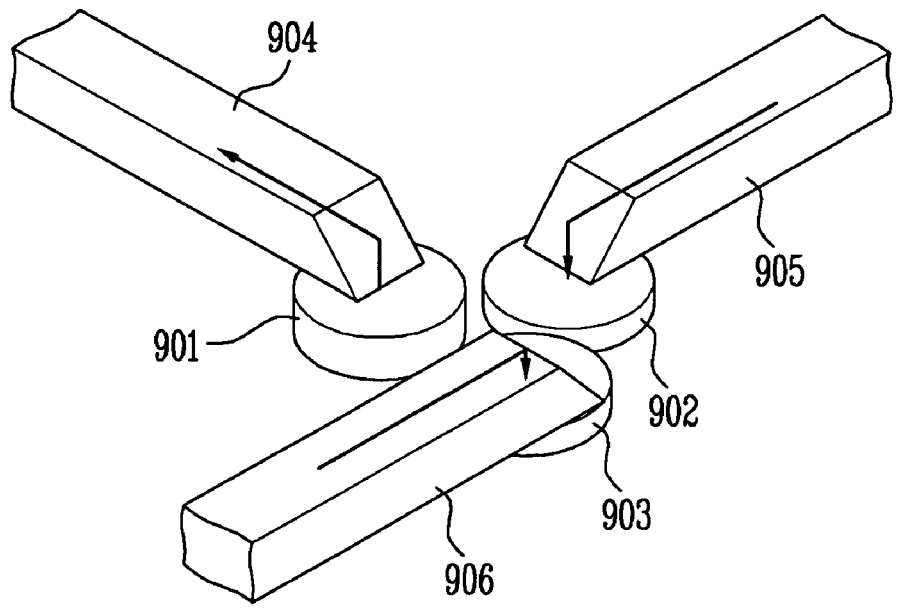
FIG. 9 is a diagram illustrating optical transmission and reception of a surface emitting laser device employing a planar optical waveguide according to an embodiment of the present invention.

FIG. 9 is a diagram illustrating optical transmission and reception of a surface emitting laser device employing a planar optical waveguide according to an embodiment of the present invention. As shown in FIG. 9, planar optical waveguides 904, 905, and 906 having a predetermined angle are connected to a surface emitting laser 901 and integrated optical sensors 902 and 903, respectively. Reflective surfaces are formed at terminals of the planar optical waveguides 904 to 906 formed with a predetermined angle, to reflect light forward. Here, the optical sensors 902 and 903 may be a predetermined number of optical sensors in order to receive a predetermined number of light beams.

Figure 10:
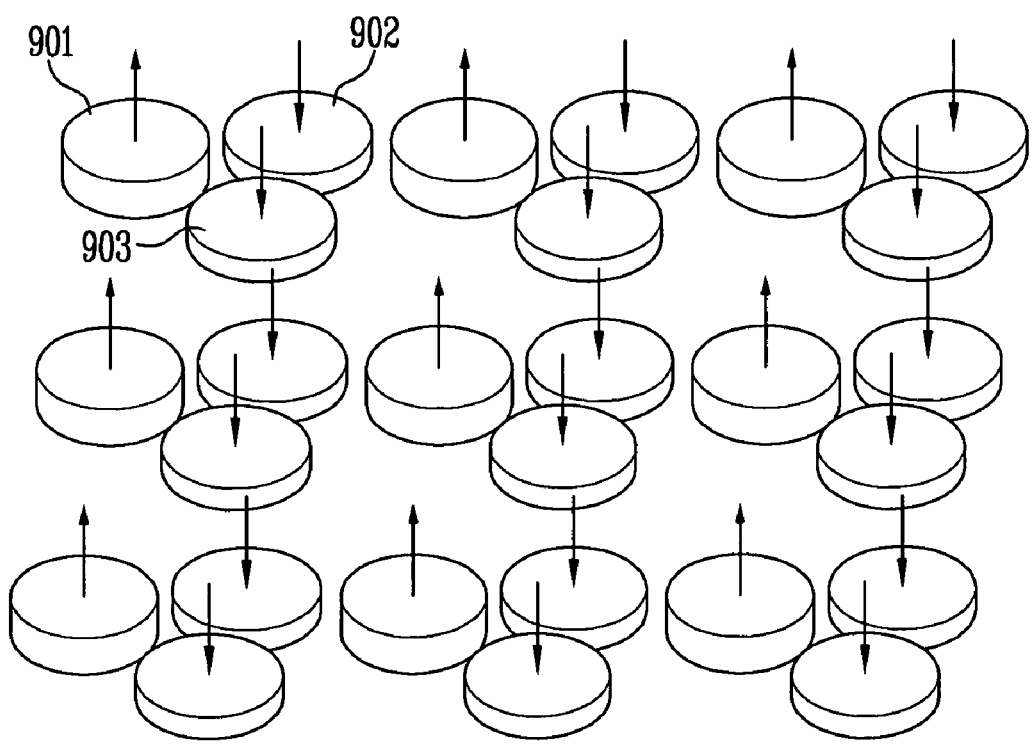
FIG. 10 is a schematic diagram illustrating an array forming a surface emitting laser device according to an embodiment of the present invention.

FIG. 10 is a schematic diagram illustrating an array forming a surface emitting laser device according to an embodiment of the present invention. As shown in FIG. 10, the surface emitting laser 901 and the optical sensors 902 and 903 may be formed as an array comprising a plurality of optical devices.

As described above, in the surface emitting laser device in which the surface emitting laser and optical sensor are simultaneously integrated, and the optical waveguide device employing the same, optical output performance of the surface emitting laser device is unaffected by the optical sensor which operates separately, exhibits high performance, and can respond within a wide wavelength band.

While the present invention has been described with reference to exemplary embodiments illustrated in the drawings, the present invention is not limited to the described embodiments, and it will be appreciated by those skilled in the art that various modifications can be made without departing from the spirit and scope of the present invention defined by the appended claims and their equivalents.

What is claimed is:

1. A surface emitting laser device including an optical sensor, the device comprising:
    a surface emitting laser formed on a substrate and generating a laser beam;
    an optical sensor formed adjacent to the surface emitting laser on the substrate and receiving external light; and
    an absorbent layer formed on a side surface of the surface emitting laser adjacent to the optical sensor, wherein the surface emitting laser is formed to have a predetermined structure in which a first reflector, a first cladding layer, an active layer, a second cladding layer, and a second reflector are stacked in sequence on a semiconductor layer, and the optical sensor is adjacent to the surface emitting laser on the substrate and formed to have a predetermined structure in which a part of the semiconductor layer and the first reflector are exposed, the laser beam generated on the surface emitting laser and the external light received on the optical sensor are different in wavelength.

2. The surface emitting laser device of claim 1, wherein the surface emitting laser further includes:
    a lower electrode formed on an exposed part of the first cladding layer; and
    a upper electrode formed on an exposed edge of the second cladding layer.

3. The surface emitting laser device of claim 1, wherein the optical sensor further includes: a lower electrode formed on an exposed area of the substrate; and a upper electrode formed on an exposed part of the semiconductor layer.

4. The surface emitting laser device of claim 1, wherein the first reflector of the optical sensor reflects light output from the surface emitting laser.

5. The surface emitting laser device of claim 1, wherein the surface emitting laser further includes a sensor for optical monitoring disposed at a lower part thereof.

6. The surface emitting laser device of claim 5, wherein the sensor for optical monitoring includes subsidiary semiconductor layers and subsidiary sensing electrodes further formed on the substrate.

7. The surface emitting laser device of claim 1, wherein the surface emitting laser and the optical sensor are formed as an array.

8. An optical waveguide device comprising: the surface emitting laser device according to claim 1; and an optical waveguide guiding light transmitted by the surface emitting laser and to be received by the optical sensor.

9. The optical waveguide device of claim 8, wherein there is a plurality of optical sensors.

10. The optical waveguide device of claim 8, wherein the optical waveguide is one of a multimode optical waveguide and a planar optical waveguide.

* * * * *